(12) United States Patent
Ortner et al.

(10) Patent No.: US 9,748,962 B2
(45) Date of Patent: Aug. 29, 2017

(54) SYSTEMS AND METHODS FOR OSCILLATORS USING QUADRATIC TEMPERATURE COMPENSATION

(71) Applicant: Infineon Technologies AG, Neubiberg (DE)

(72) Inventors: Markus Ortner, Linz (AT); Manfred Punzenberger, Gallneukirchen (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/920,476

(22) Filed: Oct. 22, 2015

(65) Prior Publication Data
US 2017/0117908 A1    Apr. 27, 2017

(51) Int. Cl.
H03L 1/00 (2006.01)
H03L 7/24 (2006.01)
H03L 1/02 (2006.01)

(52) U.S. Cl.
CPC . *H03L 7/24* (2013.01); *H03L 1/02* (2013.01)

(58) Field of Classification Search
CPC .................................. H03L 7/24; H03L 1/02
USPC ...................... 331/66, 70, 176, 185
See application file for complete search history.

(56) References Cited

U.S. PATENT DOCUMENTS

| | | | | | |
|---|---|---|---|---|---|
| 4,560,959 | A | * | 12/1985 | Rokos | G05F 3/225 331/116 R |
| 8,587,384 | B2 | * | 11/2013 | Satoh | H03L 1/025 331/117 R |
| 2008/0150641 | A1 | * | 6/2008 | Costa | H03L 7/099 331/16 |
| 2012/0249251 | A1 | * | 10/2012 | Nakamura | H03L 1/025 331/66 |

OTHER PUBLICATIONS

M. P. Cracknell, et al.; "A New Technique for the Temperature Compensation of Saw Oscillators"; STC Components, UK, Apr. 10-13, 1989, p. 49-52.
Martin Schaliner, et al.; "Adjustment of a Temperature Compensated Ka-Band Ring Resonator VCO Using Fully Automated Laser-Trimming"; 2001 IEEE MTT-S Digest, p. 2179-2182.
Leonard D. Cohen, et al.; "Frequency/Temperature Compensated Millimeter-Wave Oscillators and Broadband VCO's in Lumped-Element and Printed-Circuit Forms"; 1986 IEEE MTT-S Digest, p. 169-172.
T. Tanzawa, et al.; "A Temperature-Compensated CMOS LC-VCO Enabling the Direct Modulation Architecture in 2.4GHz GFSK Transmitter"; IEEE 2004 Custom Integrated Circuits Conference; p. 273-276.

(Continued)

*Primary Examiner* — Richard Tan
(74) *Attorney, Agent, or Firm* — Eschweiler & Potashnik, LLC

(57) ABSTRACT

A voltage controlled oscillator arrangement is disclosed. The arrangement includes a voltage controlled oscillator and a quadratic extension component. The voltage controlled oscillator has a tuning port. The tuning port is configured to select an operating frequency according to an applied voltage. The quadratic extension component is configured to generate a quadratic tuning voltage that as the applied voltage to the tuning port. The quadratic tuning voltage is generated according to a linear temperature compensation signal.

19 Claims, 5 Drawing Sheets

(56) References Cited

OTHER PUBLICATIONS

Yue Wu, et al.; "A Temperature Stabilized CMOS VCO for Zero-IF Cellular CDMA Receivers"; 2005 Symposium on VLSI Circuits Digest of Technical Papers; p. 398-401.
James S. Wilson, "An Improved Method of Temperature Compensation of Crystal Oscillators"; 1983 IEEE; p. 442-447.
Kari Stadius, et al.; "A Monolithic Temperature Compensated 1.6 GHz VCO"; 28th European Microwave Conference Amsterdam 1998; p. 217-221.
Hiroshi Akima, et al.; "A 10 GHz Frequency-Drift Temperature Compensated LC VCO with Fast-Settling Low-Noise Voltage Regulator in 0.13 um CMOS"; 2010 IEEE, p. 1-4.
Jamel Nebhen, et al.; "A Temperature Compensated CMOS Ring Oscillator for Wireless Sensing Applications"; 2012 IEEE; p. 37-40.
Khaldoon AbuGharbieh, et al.; "A Wide Tuning Range 11.8 GHz Ring Oscillator VCO with Temperature and Process Compensation"; EuroCon 2013, Zagreb, Croatia; p. 1844-1848.
Guoying Wu, et al.; "A Low-Voltage and Temperature Compensated Ring VCO Design"; 2014 IEEE, p. 1-4.
Abdennaceur Kachouri, et al. "A New Temperature Compensation Method for a 2.5 GHz Integrated VCO"; IJCSNS International Journal of Computer Science and Network Security, vol. 7, No. 5, May 2007, p. 78-85.
Wilson, James S., An improved Method of Temperature Compensation of Crystal Oscillators, Article, Dec. 1983, pp. 442-447, STC Components Plc, Harlow, England.

\* cited by examiner

SYSTEMS AND METHODS FOR OSCILLATORS USING QUADRATIC TEMPERATURE COMPENSATION

BACKGROUND

Signal oscillators, such as RF signal oscillators, are used in a wide variety of applications. The applications include, for example, signal processing, data communication, circuitry testing, object detection and the like. A key characteristic is that the signal oscillators generate an oscillation signal having a stable oscillation frequency. Otherwise processing errors, communication errors, object detection and the like may not be suitably performed.

One environmental condition that impacts the oscillation signal is temperature. Changes in temperature result in unwanted changes in the oscillation frequency. The change is referred to as temperature drift.

One technique to compensate for temperature drift in voltage controlled oscillators (VCO) is to use a phase locked loop (PLL). This technique can compensate for temperature drift, however adding a PLL to a circuit adds complexity and cost. An alternative for frequency stabilization of a VCO is the use of high Q (dielectric) resonators with appropriate temperature coefficient. However, cost and effort for frequency centering by laser are high.

What is needed are techniques to mitigate or account for temperature drift without additional costly components.

DETAILED DESCRIPTION

Figure 1:
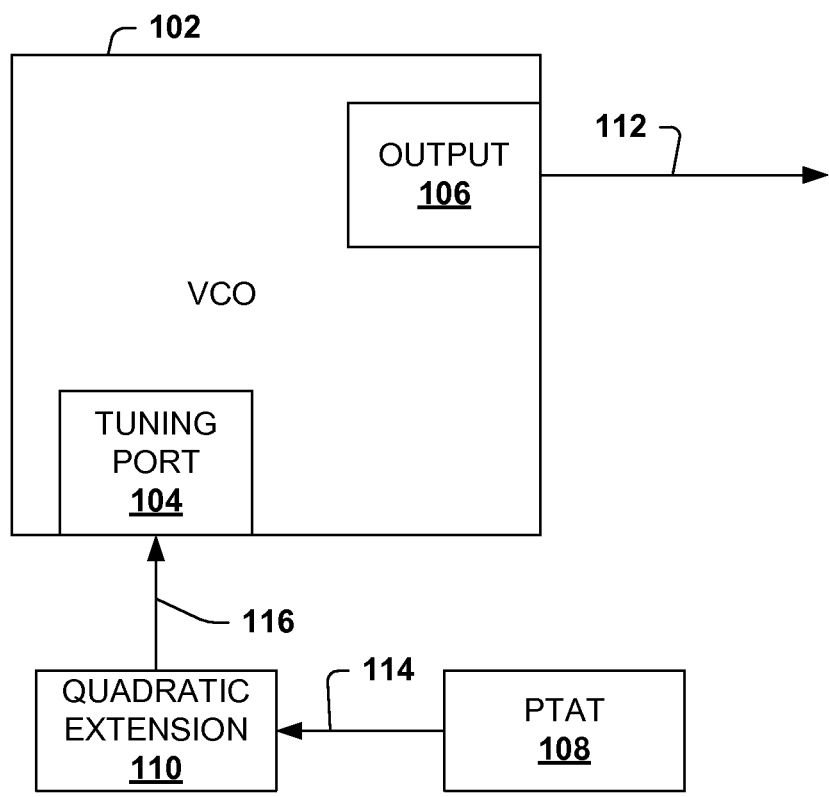
FIG. 1 is a block diagram illustrating a voltage controlled oscillator arrangement using a quadratic extension component.

The present invention will now be described with reference to the attached drawing figures, wherein like reference numerals are used to refer to like elements throughout, and wherein the illustrated structures and devices are not necessarily drawn to scale.

RF signal oscillators are used for applications including, but not limited to, communication systems, motion sensing, radar systems and the like. A typical RF oscillator is a voltage controlled oscillator (VCO). A requirement for unlocked RF signal oscillator arrangements is that they have a low or close to zero temperature dependence.

A typical VCO has temperature dependence and its operating frequency changes or drifts according to changes in temperature. This effect is referred to as temperature drift.

One approach to account for temperature dependence is to use a phase locked loop (PLL) to stabilize the operating frequency of the VCO. The PLL can be used to lock the VCO to a quartz stabilized independent reference frequency. In another approach, a microprocessor can be used to measure the VCO's operating frequency and adjust the VCO to correct its operating frequency. The above approaches require substantial additional effort beyond the VCO itself, which results in an increased bill of material, increased die area consumption and higher power consumption.

Another approach to account for temperature dependence or drive is to omit a PLL and provide a compensation signal or apply a control/tuning voltage. The change in operating frequency can be represented by a temperature coefficient. Typically, the temperature coefficient of a VCO is negative since the speed of the VCO transistors decreases when the temperature is increased. The tuning characteristic of the VCO is often positive, which means that its operating frequency is monotonically increasing with increasing tuning voltage. A compensation signal can be used to mitigate the temperature coefficient and temperature drive of the VCO by applying the compensation signal to a tuning input of the VCO. The compensation signal is generated by a component and has (in this example case) proportional to absolute temperature (PTAT) characteristics.

However, the typical compensation signal may not be sufficient to compensate the tuning characteristics to maintain the VCO within frequency bandwidth requirements. These requirements can be relatively small, such as 200 MHz, 100 MHz and the like. In another example, the frequency bandwidth requirements are expressed as a relative bandwidth, such as a bandwidth variation of 0.4% to 0.8% of an operating or VCO output frequency, such as 24 GHz throughout a temperature variation of −40 degrees C. to 85 degrees C. The typical compensation signal does not yield suitable accuracy and compensation to maintain the VCO within bandwidth requirements.

The systems, arrangements, methods and the like described below utilize an extension compensation component that generates a quadratic control voltage that is a quadratic function of temperature. The quadratic control voltage provides suitable resolution to meet even relatively small bandwidth requirements.

FIG. 1 is a block diagram illustrating a voltage controlled oscillator arrangement 100 using a quadratic extension component. The arrangement 100 generates an output signal having a stable operating frequency.

The arrangement 100 includes a voltage controlled oscillator (VCO) 102, an proportional to absolute temperature (PTAT) component 108 and an extension compensation component 110.

The VCO 102 is shown in simplified form and includes a tuning port 104 and an output 106. A quadratic control or tuning voltage 116 is applied to the tuning port 104 to selectively configure or adjust the VCO operating frequency. The control voltage or characteristic is typically, but not necessarily, positive in that a higher applied tuning voltage results in a higher operating frequency. The output 106 supplies an oscillator output signal 112 at the VCO operating frequency specified by the control voltage. The output signal 112 has a substantially stable operating frequency and does not substantially drift with temperature changes due to the applied quadratic control voltage.

The VCO 102 generates the output signal 112 with a selected duty cycle and the selected frequency. In the event that the temperature changes, the quadratic control voltage 116 generated by the extension component 110 substantially compensates for the temperature drift. The selected frequency, in one example, is within a range of 24.05 GHz to 24.25 GHz. In another example, the selected frequency is within a range of 24.075 GHz to 24.175 GHz. However, it is appreciated that other frequencies can be used as the selected frequency.

The PTAT component 108 generates a linear compensation signal 114 based on temperature, such as a variation from an ambient temperature. The compensation signal 114 can be in the form of a voltage or current and provides a linear compensation adjustment for temperature drift. The PTAT component 108 is comprised of circuitry in one example. The compensation signal 114 can be applied to the tuning port 104 to at least partially compensate for temperature drift.

The quadratic extension component 110 is configured to generate the quadratic compensation voltage 116 based on the compensation signal 114. The quadratic compensation voltage 116 provides second order temperature drift compensation. The quadratic extension component 110 can be implemented in circuitry and include, for example, bipolar junction transistors NPN or PNP. The quadratic extension component 110 includes squaring circuitry configured to generate a square of the compensation signal 114 in order to generate the quadratic compensation voltage 116.

The quadratic extension component 110 generates a quadratic compensation/tuning signal using a quadratic formula or function that is converted into the quadratic tuning voltage 116 and applied to the tuning port 104 of the VCO 102. Additionally, the quadratic extension component 110 generates the tuning voltage with relatively low power consumption. Additional details and examples of the quadratic extension component 110 are provided below.

The quadratic tuning voltage 116 provides a higher accuracy and precision by compensating for second order temperature drift. A linear temperature compensation may not compensate for second order temperature drift. The quadratic tuning voltage 116 can mitigate temperature drift to less than an allowed temperature drift, which in one example is less than about 20 MHz or less than 0.1 percent of an operating frequency. In one example, the low temperature drift permits use of the VCO 102 in pulsed modes wherein the VCO is turned ON and OFF and the temperature drift is sufficiently mitigated to permit use of the VCO 102 during startup periods. It is inherent that a short pulse in the time domain inherently has a wide bandwidth in the frequency domain. In another example, the low temperature drift permits use of the VCO 102 in continuous wave modes.

The temperature drift is the change in oscillation frequency of the VCO 102 according to temperature. The temperature drift can be expressed in terms of a temperature coefficient (TC). The temperature coefficient is defined in terms of frequency change per change in temperature.

$$TC = \frac{df}{dT}$$

The TC is typically a negative value depending on the tuning element of the VCO. Specifications or requirements can require a temperature drift and associated TC below a threshold value. The compensation signal 114 may provide a TC above the threshold value, but the quadratic compensating voltage provides a TC below the threshold value.

The quadratic extension component 110 can be calibrated by adjusting bias currents, scaling factors, transistor values and the like. The calibration can be performed during fabrication in one example. In another example, the calibration is performed during operation by comparing an actual frequency of the output signal 112 with an expected or selected operating frequency.

A buffer component (not shown), such as a capacitor, can be connected to the output of the extension component 110 in order to mitigate noise generated by the extension component 110.

Figure 2:
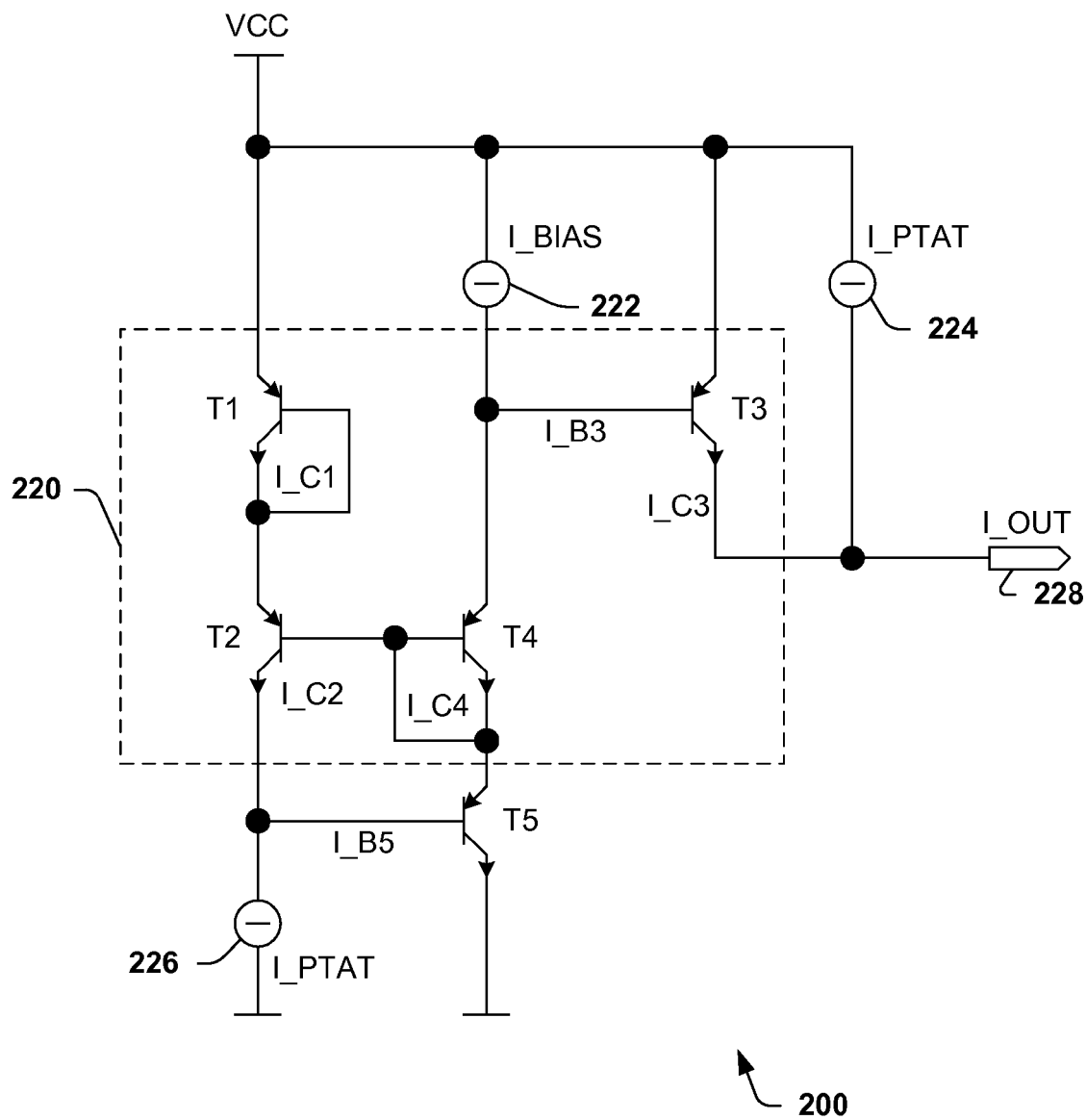
FIG. 2 is a block diagram illustrating squaring circuitry used in a quadratic compensating circuit.

FIG. 2 is a block diagram illustrating squaring circuitry 200 used in a quadratic compensating circuit. The squaring circuitry 200 is an example of suitable circuitry that can be utilized in the quadratic extension component 110 shown in FIG. 1. The squaring circuitry 200 is high precision and is a single quadrant squarer. The circuitry 200 uses five bipolar junction PNP transistors, however it is appreciated that the squarer circuitry 200 can be implemented using other types of transistors, such as bipolar NPN transistors.

The squaring circuitry 200 includes a bias current source 222, a trans linear loop 220, and PTAT current sources 224 and 226. The bias current source 222 generates a bias current that is substantially temperature independent. A transistor T5 is an auxiliary transistor configured to reduce influence of base currents of the bipolar transistors in the loop 220.

The trans linear loop 220 includes bipolar PNP transistors T1, T2, T3 and T4. The transistor T1 has its emitter connected to a supply voltage, VCC and its base connected to its collector. The transistor T2 has its emitter connected to the collector of the transistor T1. The collector of the transistor T2 is connected to the second current source 226 and to the base of the transistor T5. The transistor T3 has its base connected to the bias current source 222, its emitter connected to the supply voltage, and its collector connected to an output terminal 228. The transistor T4 has its emitter connected to the current source 222 and the base of T3, its base connected to the base of T2 and its collector. The collector of the transistor T4 is also connected to the emitter of the transistor T5. A base of the transistor T5 is connected to the second PTAT current source 226 and its collector is connected to ground. The current sources 224 and 226 are from a PTAT component, such as the compensation signal 114 from the PTAT component 108 of FIG. 1.

The linear loop 220 has the following relationship:

$$I_{C3} = \frac{(I_{PTAT} - I_{B5})^2}{I_{BIAS} - I_{B5} + I_{B3}}$$

Where $I_{B1} \approx I_{B2}$, $I_{B4} \approx I_{B5}$ are base currents and $I_{BIAS}$ is the temperature invariant bias current and can be derived from $I_{PTAT}$, which is provided by the current sources 224 and/or 226. The transistor T5 serves to reduce the influence of the base currents from the loop 220. The collector current $I_{C3}$ is approximately equal to the square of $I_{PTAT}$, scaled by the temperature invariant bias current $I_{BIAS}$.

The output current $I_{OUT}$ provided at output terminal 228 is the sum of a first order term (linear in temperature), $I_{PTAT}$, and a second order term (quadratic in temperature), $I_{C3}$. The output current $I_{OUT}$ can be converted into the quadratic tuning voltage 116 by using a suitable resistor. The bias current $I_{BIAS}$ can be scaled or adjusted to compensate for the temperature drift. Thus, the output current $I_{OUT}$ compensates for frequency drift of a VCO up to a second order.

Figure 3:
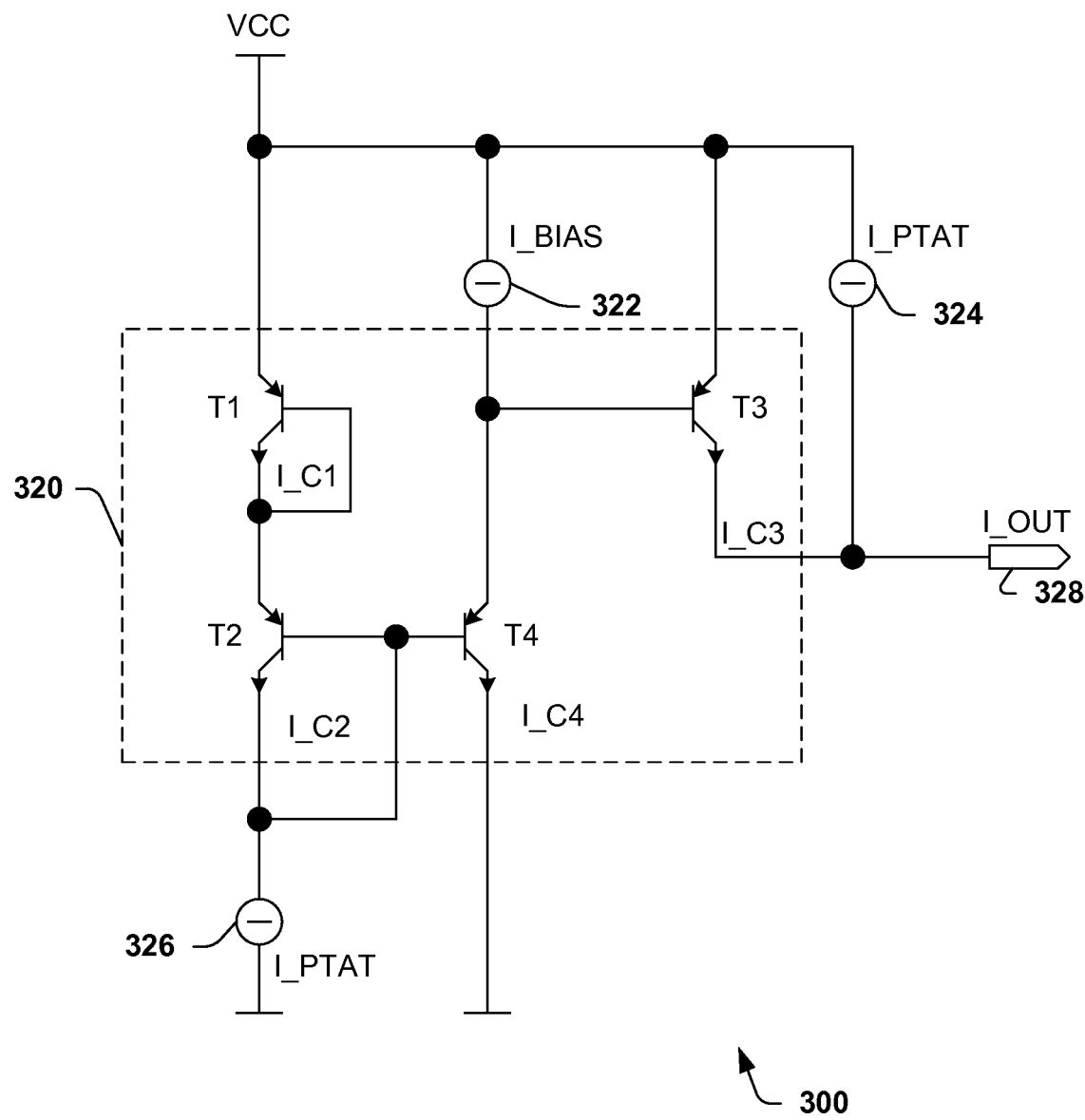
FIG. 3 is a block diagram illustrating squaring circuitry having a reduced number of transistors.

FIG. 3 is a block diagram illustrating squaring circuitry 300 having a reduced number of transistors. The squaring circuitry is used in a quadratic compensating circuit. The squaring circuitry 300 is an example of suitable circuitry that can be utilized in the quadratic extension component 110 shown in FIG. 1. The squaring circuitry 300 generally has a lower precision than the squaring circuitry 200 shown above. Additionally, the squaring circuitry 300 is a single quadrant squarer. The circuitry 300 uses four bipolar junction PNP transistors, however it is appreciated that the squarer circuitry 300 can be implemented using other types of transistors, such as bipolar NPN transistors.

The squaring circuitry 300 includes a bias current source 322, a trans linear loop 320, and PTAT current sources 324 and 326. The bias current source 322 generates a bias current that is substantially temperature independent.

The trans linear loop 320 includes bipolar PNP transistors T1, T2, T3 and T4. The transistor T1 has its emitter connected to a supply voltage, VCC and its base connected to its collector. The transistor T2 has its emitter connected to the collector of the transistor T1. Its base is connected to its collector and the base of the transistor T4. The collector of the transistor T2 is also connected to the second current source 326.

The transistor T3 has its base connected to the bias current source 322 and to the emitter of the transistor T4. The emitter of T3 is connected to the supply voltage, and its collector is connected to an output terminal 328. The transistor T4 has its emitter connected to the current source 322 and the base of the transistor T3. The base of the transistor T4 is connected to the base of T2 and the collector of the transistor T2 and the second current source 326. The collector of the transistor T4 is connected to ground. The current sources 324 and 326 are from a PTAT component, such as the compensation signal 114 from the PTAT component 108 of FIG. 1.

The linear loop 320 has the following relationship:

$$I_{C3} = \frac{(I_{PTAT} - I_{B4} - I_{B2})^2}{I_{BIAS} - I_{B4} + I_{B3}}$$

Where $I_{B1} \approx I_{B2}$, are base currents and $I_{BIAS}$ is the temperature invariant bias current and can be derived from $I_{PTAT}$, which is provided by the current sources 324 and/or 326. The collector current $I_{C3}$ is approximately equal to the square of $I_{PTAT}$, scaled by the temperature invariant bias current $I_{BIAS}$. However, the base current $I_{B2}$ of the transistor T2 influences the output current $I_{OUT}$ provided at output terminal 328.

The output current $I_{OUT}$ provided at output terminal 328 is the sum of a first order term (linear in temperature), $I_{PTAT}$, and a second order term (quadratic in temperature), $I_{C3}$. The output current $I_{OUT}$ can be converted into the quadratic tuning voltage 116 by using a suitable resistor. The bias current $I_{BIAS}$ can be scaled or adjusted to compensate for the temperature drift. In one example, the bias current $I_{BIAS}$ is adjusted using feedback from an output of a voltage controlled oscillator. The feedback compares an actual frequency with a selected operating frequency. The bias current $I_{BIAS}$ can then be adjusted to mitigate variations.

The squarer circuit 300 is shown above using PNP bipolar transistors. It is appreciated that the circuits 200 and 300 can be arranged using NPN transistors instead of PNP transistors. In one example, NPN bipolar transistors are used instead of the PNP transistors, which have a higher current gain.

Figure 4:
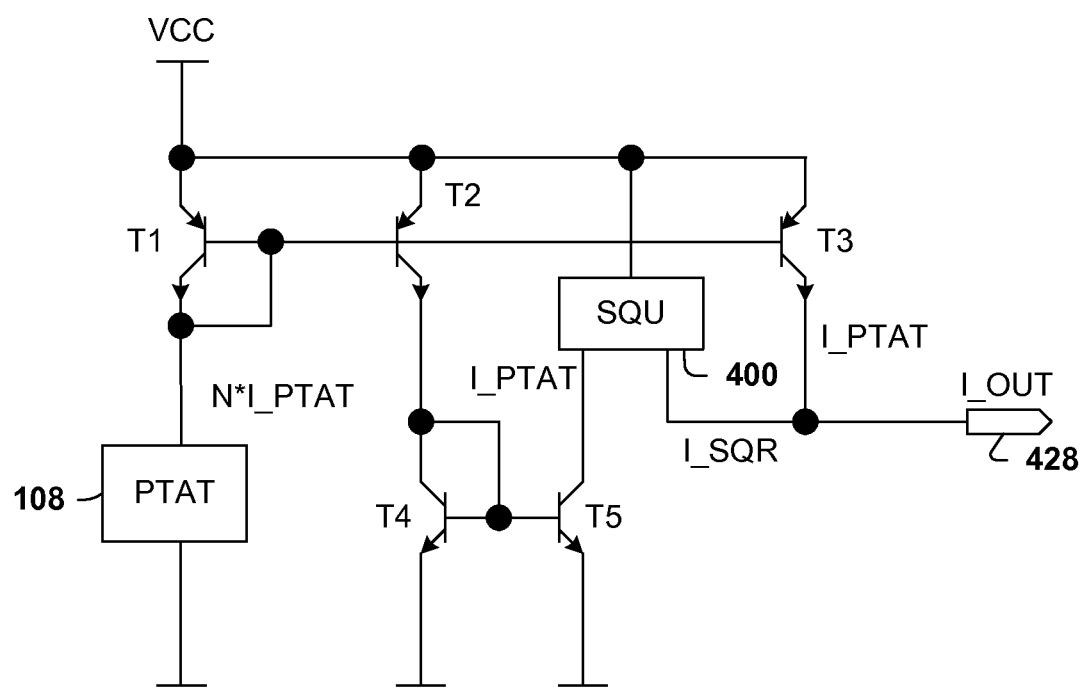
FIG. 4 is a diagram illustrating a quadratic extension component having a second order squaring function.

FIG. 4 is a diagram illustrating a quadratic extension component or arrangement 110 having a second order squaring function. The component 110 generates a quadratic tuning signal that compensates for second order temperature drift. The quadratic extension component 110 is shown with an example circuit, however it is appreciated that suitable variations in the circuit are contemplated.

The quadratic extension component 110 uses a proportional to absolute temperature (PTAT) component 108. The component 108 generates a current linearly based on temperature variations or drift. The quadratic extension component 110 includes a squarer circuit 400 and bipolar transistors T1, T2, T3, T4 and T5.

The transistor T1 is a PNP transistor and has its base connected to its collector. Its emitter is connected to a supply voltage, VCC. Its collector is connected to the PTAT component 108. The transistor T2 is a PNP transistor and has its emitter connected to the supply voltage and its base connected to the base of the transistor T1. The transistor T2 generates a mirror current at its collector. The transistor T3 is also a PNP transistor and has its emitter connected to the supply voltage and its base connected to the base of the transistor T1. The transistor T3 generates a mirror current at its collector.

The transistors T4 and T5 are bipolar NPN transistors and comprise a second mirror circuit. The collector of the transistor T4 is connected to the collector of the transistor T2. The base of T4 is also connected to the collector of T4. Its emitter is connected to ground. The transistor T5 has its collector connected to the squaring circuit 400 and its base connected to the base of the transistor T4. The emitter of the transistor T5 is connected to ground.

The squarer circuit 400 generates a squared output signal $I_{SQR}$ based on current $I_{PTAT}$ of the PTAT component 108, the current has been mirrored by the first current mirror and the second current mirror and provided to the squarer circuit 400 via the transistor T5. Examples of suitable squarer circuits are described in FIGS. 2 and 3.

The transistors T1, T2 and T3 operate as a first current mirror to reduce current pulled from the current source 108, the current $I_{PTAT}$. This first current mirror reduces the current or current consumption by a factor of N. In one example, N can be selected to be 4 and reduces current consumption and chip area used as a result. Additionally, the first current mirror is comprised of PNP bipolar transistors, in this example.

As stated above, the transistors T4 and T5 operate as the second current mirror. In one example, they mirror current from the transistor T2 with a ratio of 1, however, other mirror ratios are possible.

Figure 5:
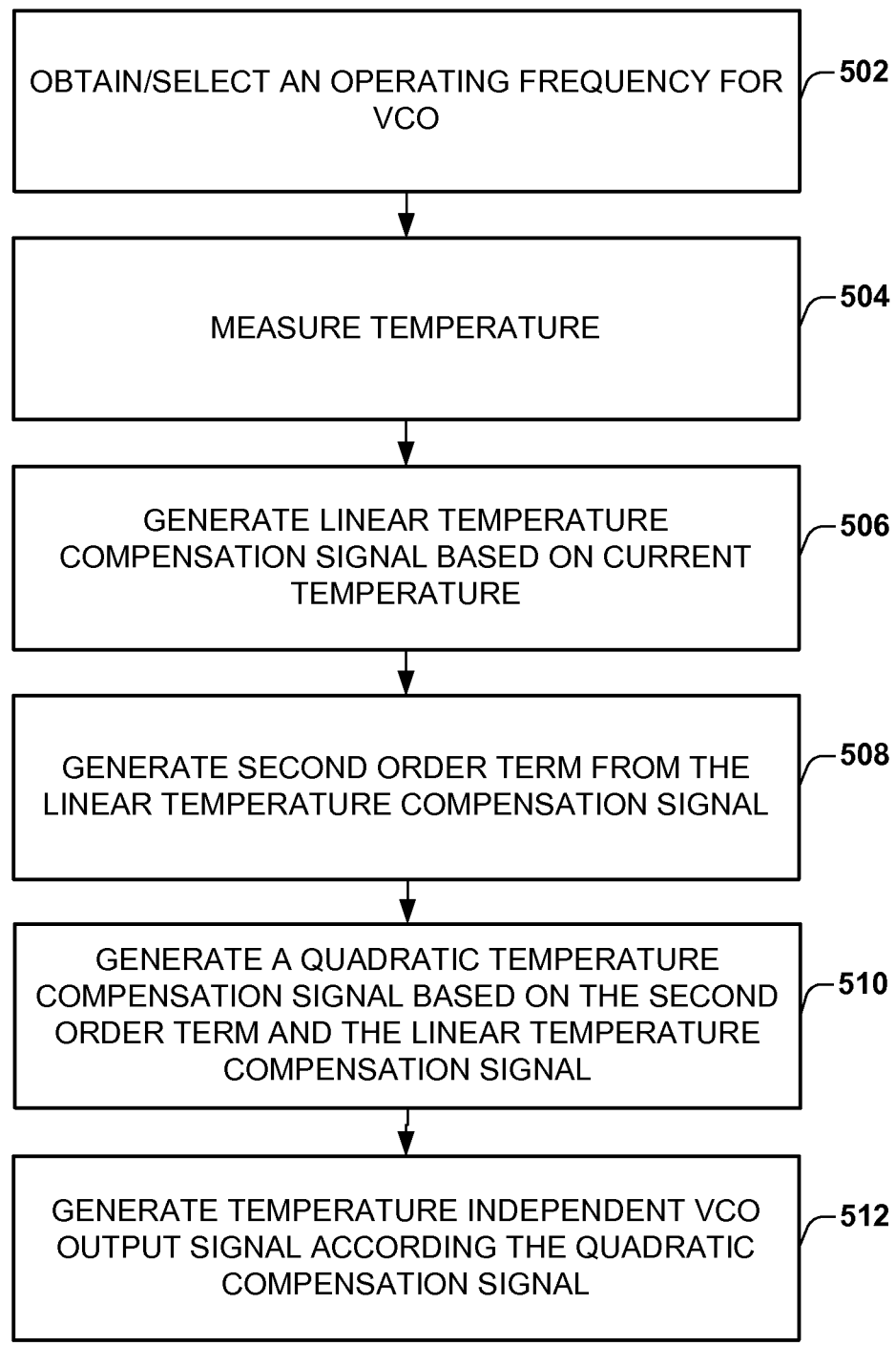
FIG. 5 is a flow diagram illustrating a method of operating a voltage controlled oscillator using second order temperature compensation.

FIG. 5 is a flow diagram illustrating a method 500 of operating a voltage controlled oscillator using second order temperature compensation. The method 500 generates an output signal at a stable operating frequency that is substantially independent of a current temperature and/or changes in temperature by compensating with second order compensation instead of only linear.

The method 500 begins at block 502 where an operating frequency for a voltage controlled oscillator (VCO) is obtained. In one example, the operating frequency is preselected. In another, the operating frequency is dynamically assigned. The operating frequency is generally a frequency within an allowed bandwidth. The allowed bandwidth can be specified in regulatory rules, specifications and the like. In one example, the allowed bandwidth is 100 MHz. In another example, the allowed bandwidth is 200 MHz.

A temperature measurement is obtained at block 504. The temperature measurement can be obtained from one or more temperature sensors. The temperature measurement can be in a form of deviation form ambient, absolute temperature and the like and is also referred to as a current temperature.

A temperature compensation signal is generated at block 506 according to the temperature measurement. The temperature compensation signal is linear. A PTAT component, such as the PTAT component 108 described above, can be configured to generate the temperature compensation signal. The signal at least partially accounts for variations of operating frequency of the voltage controlled oscillator due to temperature. Generally, an increase in temperature tends to decrease the uncompensated operating frequency and a decrease in temperature tends to increase the uncompensated operating frequency. By being linear or first order, the compensation signal may not sufficiently compensate for temperature drift and maintain the operating frequency within the allowed bandwidth.

The linear temperature compensation signal is squared at block 508 to generate a second order term. Typically, a suitable squarer circuit, such as the squarer circuits shown above in FIGS. 2-4 can be used to generate the squared signal at least partially from the linear temperature compensation signal and a temperature independent signal. The squared signal can be scaled using a selected bias current or other technique.

A quadratic compensation signal is generated at block 510 based on the second order term or squared signal, and the temperature independent signal. The quadratic compensation signal is a second order signal and compensates for second order temperature drift.

An extension component, such as the component 110 described above, can be used to generate the quadratic compensation signal. The extension component can be calibrated to more accurately generate the quadratic compensation signal.

The quadratic compensation signal can be in the form of a current. The current can be converted into a voltage by using a suitable resistor to generate a quadratic tuning voltage.

The quadratic compensation signal is applied to a tuning port to adjust operation of the VCO at block 512 and an output signal is generated at the operating frequency. The quadratic compensation signal adjusts the operating frequency to account for both first order and second order frequency variations due to temperature. The signal can be applied in the form of a control voltage by using a suitable resistor configured to transform the signal as a current into the control voltage. Thus, first and second order frequency variations due to changes in temperature can be compensated.

Generation of the quadratic compensation signal can be calibrated to improve accuracy. The actual frequency of the output signal can be measured to determine variations from the operating frequency. If there are variations of the actual frequency from the operating frequency, the generation of the quadratic compensation signal can be adjusted to improve accuracy.

In one example, the quadratic extension component is calibrated prior to use by selecting scaling factors, bias currents and/or temperature invariant current sources. In another example, measurements of the actual frequency of the output signal are used as feedback by the quadratic extension component and/or the linear compensation component to modify generation of the quadratic compensation signal and/or the linear compensation signal.

As a result of the quadratic tuning voltage, the operating frequency of the VCO is maintained within the allowed range of frequencies.

While the method is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

It is appreciated that the claimed subject matter may be implemented as a method, apparatus, or article of manufacture using standard programming and/or engineering techniques to produce software, firmware, hardware, or any combination thereof to control a computer to implement the disclosed subject matter (e.g., the systems, arrangements and the like shown in FIGS. 1, 2, etc., are non-limiting examples that may be used to implement the above methods). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

A voltage controlled oscillator arrangement is disclosed. The arrangement includes a voltage controlled oscillator and a quadratic extension component. The voltage controlled oscillator has a tuning port. The tuning port is configured to select an operating frequency according to an applied voltage. The quadratic extension component is configured to generate a quadratic tuning voltage that as the applied voltage to the tuning port. The quadratic tuning voltage is generated according to a linear temperature compensation signal.

A quadratic extension arrangement for generating a quadratic temperature compensation signal is disclosed. The arrangement includes a first current mirror, a second current mirror, a squarer circuit and a linear compensation component. The first current mirror is configured to generate a first mirrored current from a linear temperature compensation signal. The second current mirror is configured to generate a second mirrored current from the first mirrored current. The linear compensation component is configured to generate the linear compensation signal according to a current temperature. The squarer circuit is configured to generate a second order term from the linear compensation signal.

In one example the arrangement further includes an output configured to combine the second order term with the first mirror current to generate a quadratic temperature compensation signal.

In another example, the squarer circuit includes a trans linear loop of transistors.

In another example, the transistors are PNP bipolar transistors.

In yet another example, the transistors are NPN bipolar transistors.

A method of operating a voltage controlled oscillator using second order temperature compensation is disclosed. A current temperature is obtained. A linear temperature compensation signal is generated according to the current temperature. A second order term is generated from the linear temperature compensation signal. A quadratic temperature compensation signal is generated using the second order term and the linear temperature compensation signal.

In one example, the method further includes adjusting an operating frequency of a voltage controlled oscillator according to the quadratic temperature compensation signal.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A voltage controlled oscillator arrangement comprising:
    a voltage controlled oscillator having a tuning port, wherein the tuning port is configured to select an operating frequency according to an applied voltage;
    a quadratic extension circuit configured to generate a quadratic tuning voltage as the applied voltage to the tuning port, wherein the quadratic tuning voltage is generated according to a linear temperature compensation signal; and
    wherein the quadratic extension further comprises:
        a linear compensation circuit configured to generate the linear temperature compensation signal according to a current temperature; and
        a squarer circuit configured to generate a second order term for the quadratic tuning voltage according to the linear temperature compensation signal, wherein the squarer circuit comprises a trans linear loop configured to scale the second order term by a bias current, and wherein the quadratic extension circuit is further configured to combine the scaled second order term with the linear temperature compensation signal to generate the quadratic tuning voltage.

2. The arrangement of claim 1, wherein the quadratic extension circuit is further configured to generate the quadratic tuning voltage using a temperature invariant current.

3. The arrangement of claim 1, wherein the quadratic extension circuit scales the linear temperature compensation signal using the bias current.

4. The arrangement of claim 1, wherein the voltage controlled oscillator has first order frequency variations according to temperature variations and second order frequency variations according to the temperature variations.

5. The arrangement of claim 4, wherein the linear temperature compensation signal mitigates the first order frequency variations.

6. The arrangement of claim 5, wherein the quadratic tuning voltage mitigates the second order frequency variations.

7. The arrangement of claim 6, wherein the voltage controlled oscillator is configured to generate an output signal at the operating frequency.

8. The arrangement of claim 1, wherein the linear temperature compensation signal is a proportional to an absolute temperature.

9. The arrangement of claim 1, wherein the trans linear loop comprises a loop of PNP bipolar transistors.

10. A quadratic extension arrangement for generating a quadratic temperature compensation signal, the arrangement comprising:
    a first current mirror configured to generate a first mirrored current from a linear temperature compensation signal;
    a second current mirror configured to generate a second mirrored current from the first mirrored current;
    a linear compensation circuit configured to generate the linear compensation signal according to a current temperature;
    a squarer circuit configured to generate a second order term from the second mirror current; and
    an output configured to combine the second order term with the first mirror current to generate the quadratic temperature compensation signal.

11. The arrangement of claim 10, wherein the linear temperature compensation signal is proportional to an absolute temperature.

12. The arrangement of claim 10, wherein the squarer circuit includes a trans linear loop of transistors.

13. The arrangement of claim 12, wherein the transistors are PNP bipolar transistors.

14. The arrangement of claim 12, wherein the transistors are NPN bipolar transistors and the squarer circuit includes a temperature invariant current source.

15. The arrangement of claim 12, wherein the squarer circuit includes an auxiliary transistor configured to reduce base currents of transistors with the squarer circuit.

16. A method of operating a voltage controlled oscillator using second order temperature compensation, the method comprising:
    obtaining a current temperature;
    generating a linear temperature compensation signal according to the current temperature;
    generating a second order term from the linear temperature compensation signal using a squarer circuit;
    scaling the second order term based on a bias current; and
    generating a quadratic temperature compensation signal using the second order term and the linear temperature compensation signal.

17. The method of claim 16, further comprising adjusting an operating frequency of the voltage controlled oscillator according to the quadratic temperature compensation signal.

18. The method of claim 17, wherein the operating frequency is within an allowed range of frequencies.

19. The method of claim 16, wherein the bias current is temperature invariant.

* * * * *